(12) United States Patent
Tsai et al.

(10) Patent No.: US 9,729,121 B2
(45) Date of Patent: Aug. 8, 2017

(54) LC TANK CAPABLE OF REDUCING ELECTROMAGNETIC RADIATION BY ITSELF AND MANUFACTURING METHOD THEREOF

(71) Applicant: REALTEK SEMICONDUCTOR CORPORATION, Hsinchu (TW)

(72) Inventors: Chih-Yu Tsai, Hsinchu (TW); Kai-Yi Huang, Taipei (TW); Hsiao-Tsung Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 179 days.

(21) Appl. No.: 14/642,618

(22) Filed: Mar. 9, 2015

(65) Prior Publication Data

US 2015/0381135 A1    Dec. 31, 2015

(30) Foreign Application Priority Data

Jun. 30, 2014 (TW) .............................. 103122451 A (51) Int. Cl.
| H03H 7/01 | (2006.01) |
| H01F 27/28 | (2006.01) |
| H03H 5/00 | (2006.01) |
| H03H 5/12 | (2006.01) |

(52) U.S. Cl.
CPC ....... H03H 7/0115 (2013.01); H01F 27/2804 (2013.01); H03H 5/006 (2013.01); H03H 5/12 (2013.01)

(58) Field of Classification Search
CPC ...... H03H 7/0115; H03H 1/0007; H03H 5/12; H03H 5/006; H01F 17/0013; H01F 27/28; H01F 27/2804; H01F 27/2823; H04H 7/0115
USPC ........... 333/12, 175, 181, 185; 336/200, 226
See application file for complete search history.

(56) References Cited

U.S. PATENT DOCUMENTS

| 7,151,430 B2 | 12/2006 | Mattsson |
| 7,418,251 B2* | 8/2008 | Liu ..................... H03H 7/0115 333/175 |
| 7,535,330 B2 | 5/2009 | Erickson et al. |
| 8,183,971 B2 | 5/2012 | Le Guillou et al. |
| 2005/0195061 A1 | 9/2005 | Terrovitis |

* cited by examiner

*Primary Examiner* — Benny Lee
*Assistant Examiner* — Jorge Salazar, Jr.
(74) *Attorney, Agent, or Firm* — WPAT, P.C., Intellectual Property Attorneys; Anthony King (57) ABSTRACT

The present invention discloses an LC tank capable of reducing electromagnetic radiation by itself and the manufacturing method of the same. An embodiment of said LC tank comprises: a first tank area whose boundary is defined by a first part of an inductance; a second tank area whose boundary is defined by a second part of the inductance in which the second part includes a gap; a cross-interconnection structure operable to electrically connect the first and second parts of the inductance and distinguish the first tank area from the second tank area; and at least one capacitance formed inside at least one of the first and second tank areas, wherein the area ratio of the first tank area to the second tank area is between 20% and 80%.

17 Claims, 10 Drawing Sheets

LC TANK CAPABLE OF REDUCING ELECTROMAGNETIC RADIATION BY ITSELF AND MANUFACTURING METHOD THEREOF

BACKGROUND OF THE INVENTION

1. Field of the Invention

The present invention relates to an inductance-capacitance (LC) tank and the manufacturing method thereof, especially to an LC tank capable of reducing electromagnetic radiation by itself and the manufacturing method of the same.

2. Description of Related Art

Electronic products will generate electromagnetic waves during operation, which may interfere with the normal operation of other devices and cause human health harmful influence. In view of this problem, most countries establish regulations against electromagnetic waves of electronic products, so as to prevent the damage of electromagnetic interference (EMI).

The main component "integrated circuit (IC)" of an electronic product is a major source of electromagnetic waves in which the electromagnetic waves from an "inductor" of the IC will not only interfere with external devices but also the operation of internal devices in certain applications. In order to reduce electromagnetic waves from the inductor of an IC, some prior arts make the inductor in the shape of symmetry and thereby reduce its radiation. However, this kind of prior arts merely takes the inductor into consideration while other aspects in design are put aside.

People who are interested in the said prior arts may refer to the documents in accordance with the following information: U.S. Pat. No. 7,535,330, U.S. Patent Application No. 2005/0195061, U.S. Pat. Nos. 8,183,971, and 7,151,430.

SUMMARY OF THE INVENTION

In consideration of the problems of prior arts, an object of the present invention is to provide an inductance-capacitance (LC) tank capable of reducing electromagnetic radiation by itself and the manufacturing method of the same, so as to resolve the electromagnetic radiation problems through the whole resonant tank instead of an inductor alone.

The present invention discloses an inductance-capacitance (LC) tank capable of reducing electromagnetic radiation by itself. An embodiment of this LC tank comprises: a plurality of tank areas, a cross-interconnection structure and at least one capacitance. The said plurality of tank areas includes: a first tank area whose boundary is defined by a first part of an inductance; and a second tank area whose boundary is defined by a second part of the inductance in which the second part includes a gap and the area ratio of the first tank area to the second tank area is between 20% and 80%. The said cross-interconnection structure is operable to electrically connect the first and second parts of the inductance and distinguish the first tank area from the second tank area. The said at least one capacitance is formed/set/located inside at least one of the plurality of tank areas, e.g., the mentioned second tank area. In this embodiment, the LC tank is a part of an integrated circuit.

The present invention also discloses an inductance-capacitance (LC) tank manufacturing method for making an LC tank capable of reducing electromagnetic radiation by itself. An embodiment of this method comprises the following steps: forming a plurality of tank areas, forming a cross-interconnection structure and forming at least one capacitance. In detail, the step of forming the plurality of tank areas includes: determining the size of a first tank area and the size of a second tank area in accordance with an electromagnetic radiation restraining effect; defining the first tank area with a first part of an inductance; and defining the second tank area with a second part of the inductance in which the second part includes a gap. The step of forming the cross-interconnection structure is operable to electrically connect the first and second parts of the inductance and distinguish the first tank area from the second tank area. The step of forming the at least one capacitance is operable to form the at least one capacitance inside at least one of the plurality of tank areas. In this embodiment, the LC tank manufacturing method is a part of an integrated circuit manufacturing process.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this invention field. If any term is defined in the specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. In addition, the following description relates to an inductance-capacitance (LC) tank and the manufacturing method thereof, and the details of the tank and method that have been well known in this field will be omitted if such details have little to do with the features of the present invention. Furthermore, the shape, size, and ratio of any element and the step sequence of any flow chart in the disclosed figures are just exemplary for understanding, not limitations in the scope of this invention.

The present invention comprises an LC tank capable of reducing electromagnetic radiation by itself and the manufacturing method of the same. The LC tank and method are operable to achieve the effect of restraining electromagnetic radiation through the whole LC tank. Provided that an alternative means is available and reasonable, people of ordinary skill in the art can use such means similar or equivalent to that described in this specification to carry out the present invention. The LC tank of the present invention may comprise well known elements, and the detail of such elements will be omitted provided that this omission nowhere dissatisfies the disclosure and enablement requirements. In addition, the method of the present invention could be carried out by utilizing existing or self-developed semiconductor manufacturing processes.

Figure 1:
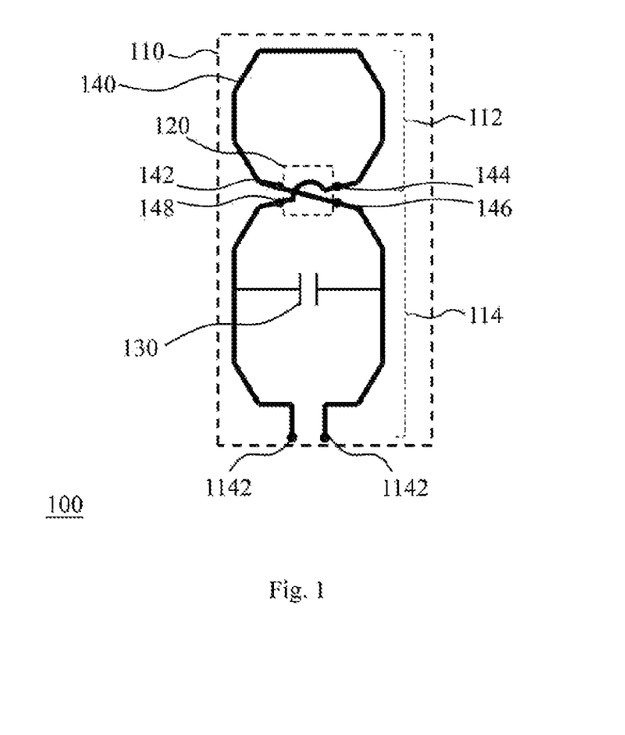
FIG. 1 illustrates an embodiment of the LC tank of the present invention.

Please refer to FIG. 1 which illustrates an embodiment of the LC tank of the present invention. As it is shown in FIG. 1, the LC tank 100 comprises: a plurality of tank areas 110, a cross-interconnection structure 120 and at least one capacitance 130. The said plurality of tank areas 110 includes: a first tank area 112 whose boundary is defined by a first part of an inductance 140; and a second tank area 114 whose boundary is defined by a second part of the inductance 140. In this embodiment, the first and second tank areas 112, 114 are at the same layer of an integrated circuit, which implies that the LC tank 100 pertains to the integrated circuit; however, in an alternative embodiment, the first and second tank areas 112, 114 could be formed at different layers of an integrated circuit. The said cross-interconnection structure 120 is operable to electrically connect the first and second parts of the inductance 140 and thus make a first node 142 and a second node 144 of the first part be electrically connected with a first node 146 and a second node 148 of the second part respectively, and the cross-interconnection structure 120 is also operable to distinguish the first tank area 112 from the second tank area 114. In this embodiment, the cross-interconnection structure 120 goes across multi-layers of the above-mentioned integrated circuit, allows the first node 142 and the first node 146 to electrically connect with each other at the layer where they are located, and makes the second node 144 and the second node 148 electrically connect with each other through another layer which is different from the one they are located, so that the second nodes 144, 148 won't be connected with the first nodes 142, 146 directly and the characteristic of the LC tank 100 can be kept unchanged. Please note that although the outlines of these nodes 142, 144, 146, 148 are dots in FIG. 1, this is just exemplary for understanding and not a limitation in the structure or shape of the nodes 142, 144, 146, 148. In practice, each node is a part of the inductance 140, and some nodes (e.g., nodes 142, 146) connecting with each other at the same layer could be regarded as the same node or different nodes while some nodes (e.g., nodes 144, 148) connecting with each other through another layer are usually regarded as different nodes; however, the definition of whether nodes are different or pertains to the same node can be given by those carrying out the present invention. The said at least one capacitance 130 is formed/set/located inside at least one of the plurality of tank areas 110 such as the second tank area 114 (as shown in FIG. 1), or inside the first and second tank areas 112, 114 concurrently, or inside a tank area such as the third tank area 116 of FIG. 5 other than the first and second tank areas 112, 114, or inside at least one of the first, second and third tank areas 112, 114, 116. Moreover, once the at least one capacitance 130 is formed/set/located inside at least one of the plurality of tank areas 110, not only the LC tank 100 is given the capability of electromagnetic radiation suppression, but also the overall circuit layout area is reduced. In this embodiment, the at least one capacitance 130 is a metal-oxide-metal (MOM) capacitance, a poly-insulator-poly (PIP) capacitance, a metal-oxide-semiconductor (MOS) capacitance, or the like. In addition, the area ratio of the first tank area 112 to the second tank area 114 is set between 20% and 80%, the area ratio of the first tank area 112 or second tank area 114 to the LC tank 100 is set between 20% and 80%, the area ratio or the inductance ratio of the first part of the inductance 140 to the second part of the inductance 140 is set between 20% and 80%, or the area ratio or the inductance ratio of the first or second part of the inductance 140 to the total area or inductance value of the inductance 140 is set between 20% and 80%. For instance, if the LC tank 100 is adopted in a wireless network communication product (e.g., a voltage-controlled oscillating circuit of a wireless communication chip), the above-mentioned area ratio or inductance ratio could be set between 40% and 60%. In this embodiment, the area ratio of the first tank area 112 to the second tank area 114 could be determined according to an electromagnetic radiation restraining effect which could be predetermined according to the relation between the area ratio of resonant areas (e.g., two resonant areas corresponding to the first and second tank areas 112, 114) and an electromagnetic radiation from an LC resonant tank including the resonant areas in which the relation could be obtained through observation, simulation, experiment or measurement.

Figure 2:
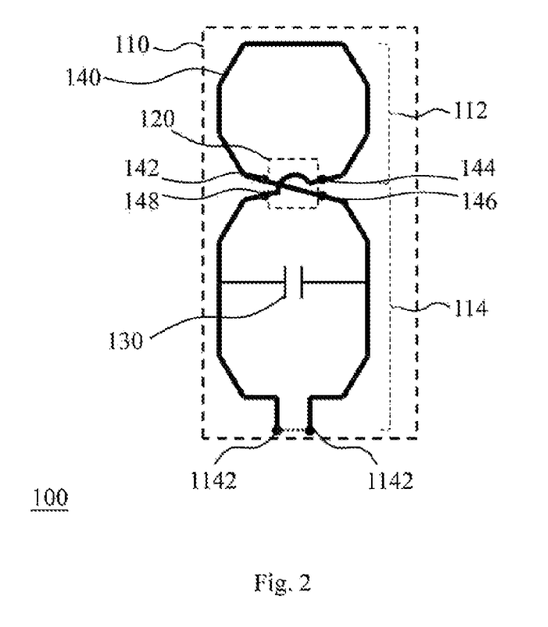
FIG. 2 illustrates how to define the size of the second tank area by virtually connecting the contacts for connection with an outside area.
Figure 3A:
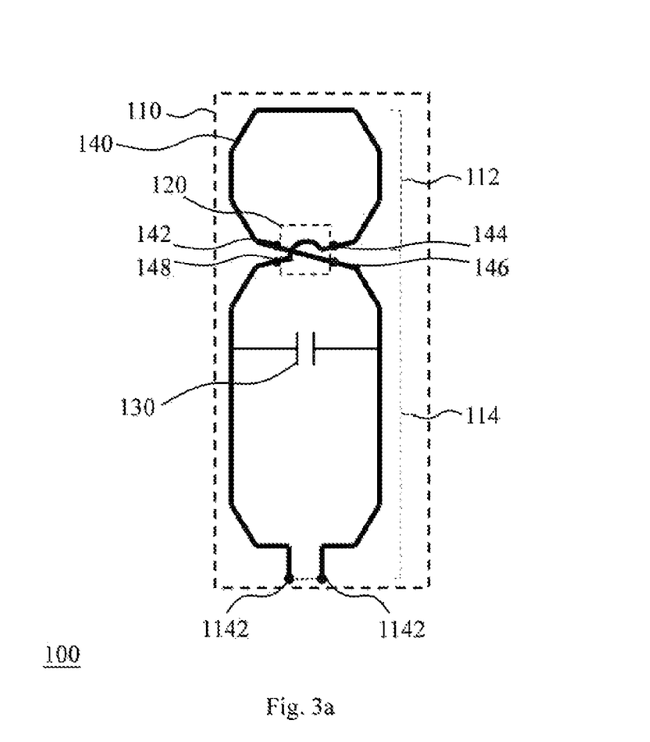
FIG. 3a illustrates a modification of FIG. 1 in which the first and second tank areas are different in size.
Figure 3B:
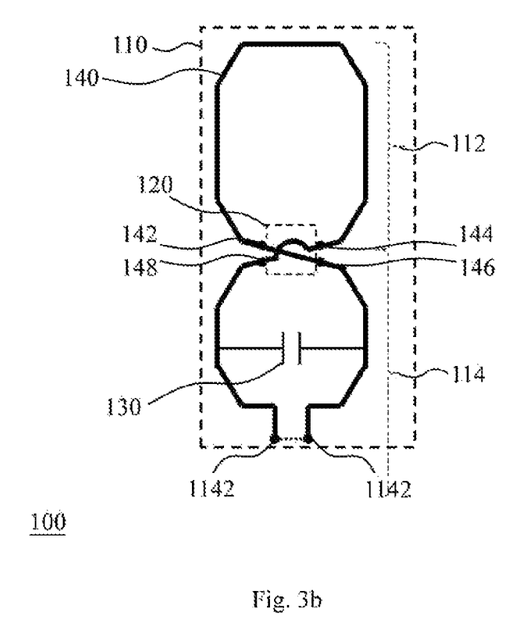
FIG. 3b illustrates another modification of FIG. 1 in which the first and second tank areas are different in size.
Figure 4:
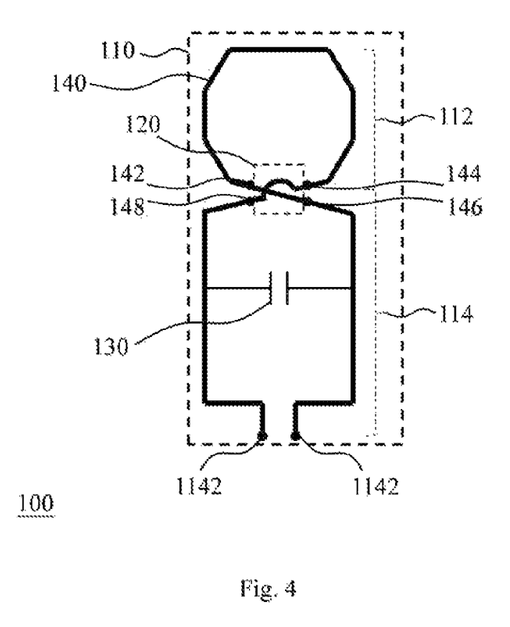
FIG. 4 illustrates a modification of FIG. 1 in which the first and second tank areas are different in shape.
Figure 5:
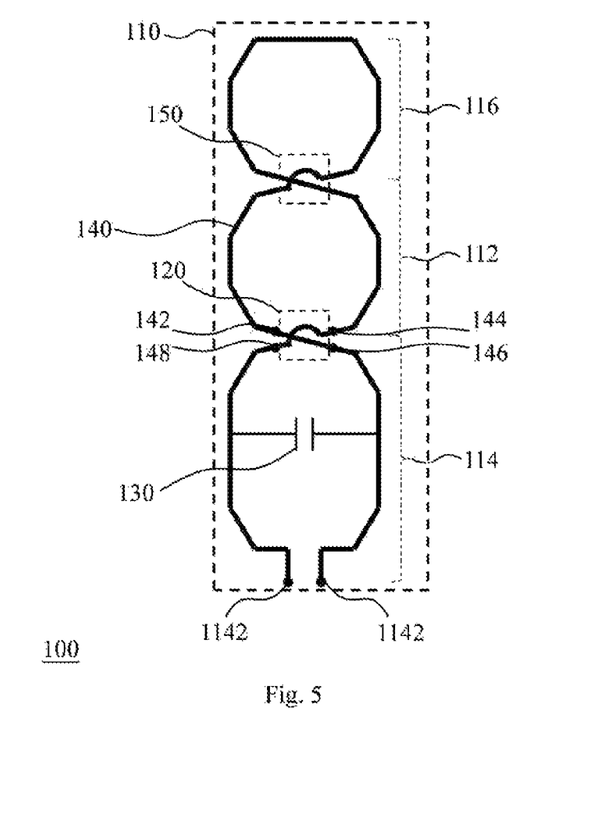
FIG. 5 illustrates another embodiment of the LC tank of the present invention.

Please refer to FIG. 1 again. The first tank the area 112 is a closed area including no contacts for connection with an outside area, and the second tank area 114 is an open area including two contacts for connection with an outside area. More specifically, the second part of the inductance 140 in the structure of the LC tank 100 includes a gap. Furthermore, as it is shown in FIG. 2, the area of the second tank area 114 is defined by virtually connecting the two contacts 1142 for connection with the outside area in a shortest way, and each of the contacts 1142 for connection with the outside area is a contact operable to be connected with an element other than the element pertaining to the LC tank 100. Besides, as it is shown in FIG. 3a and FIG. 3b, in an alternative embodiment of the present invention the first tank area 112 and the second tank area 114 are different in size; furthermore, as it is shown in FIG. 4, in another embodiment of the present invention the first tank area 112 and the second tank area 114 are asymmetric or different in shape. In practice, provided that a manufacturing process is available, the shapes of the first and second tank areas 112, 114 are free for those of ordinary skill in the art to decide. In addition, the plurality of tank areas 110 may include an area other than the first and second tank areas 112, 114. As it is shown in FIG. 5, the plurality of tank areas 110 further comprises a third tank area 116 whose boundary is defined by a third part of the inductance 140; meanwhile, the LC tank 100 further comprises another cross-interconnection structure 150 which is operable to electrically connect the third and first parts of the inductance 140 and distinguish the third tank area 116 from the first tank area 112 (that is to say defining the border between the third and first tank areas 116, 112). In this scenario, the layer relation between the third and first tank areas 116, 112 and the way they connect with each other are similar to or the same as the aforementioned layer relation and connection manner of the first and second tank areas 112, 114. Of course people of ordinary skill in the art are allowed to make adjustment in the layer relation and/or connection manner based on the disclosure of the present invention.

Figure 6:
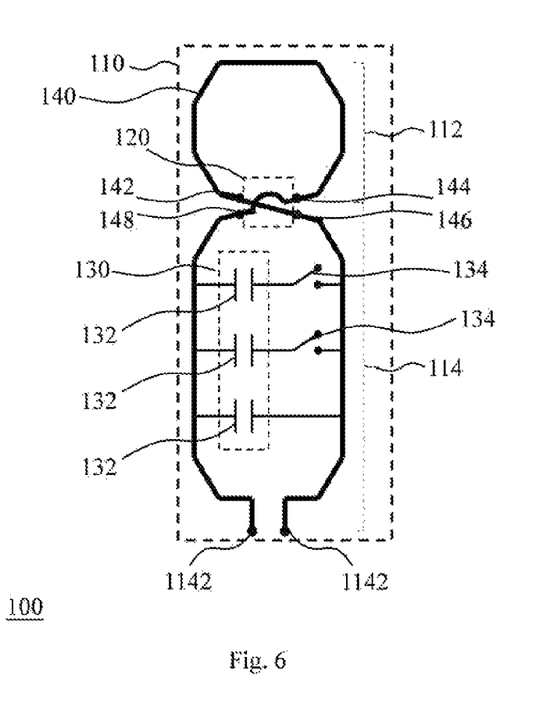
FIG. 6 illustrates a modification of the at least one capacitance of FIG. 1.

Please refer to FIG. 6 which is a modification of the embodiment of FIG. 1. The at least one capacitance 130 here includes a plurality of capacitance units 132 connected in parallel in which at least one of the capacitance units 132 is connected to the inductance 140 through at least one switch 134 which is operable to be turned on and off according to a control signal. Therefore those putting the present invention into practice may control the capacitance value of the LC tank 100 through controlling the on/off state of the switch 134, and the capacitance value will determine a resonance frequency of the LC tank in conjunction with the inductance 140.

Figure 7:
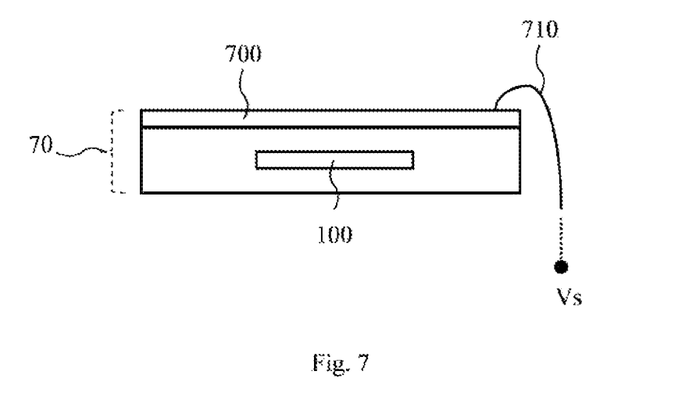
FIG. 7 illustrates a modification of FIG. 1 in which a metal or wave-adsorbing layer is formed to cover at least one side or face of the LC tank.
Figure 8:
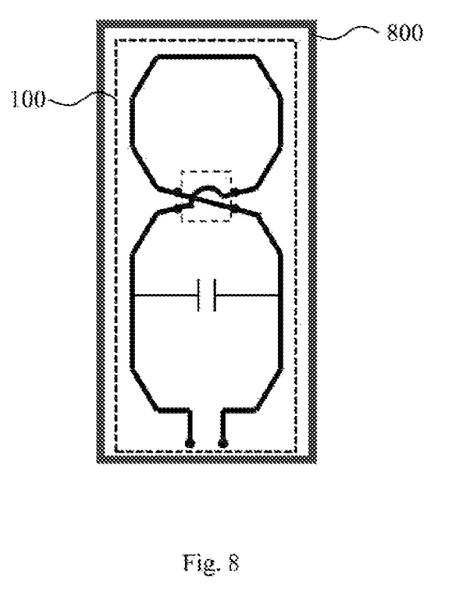
FIG. 8 illustrates a modification of FIG. 1 in which the periphery of the LC tank includes a guard ring.

Please refer to FIG. 7. In an embodiment of the present invention, a metal or wave-adsorbing layer 700 is formed to cover at least one side or at least one face of the LC tank 100. This metal or wave-adsorbing layer 700 is operable to be electrically connected with a steady voltage Vs through a wire 710 or an internal circuit wiring (e.g., the wiring of an integrated circuit), so that the electromagnetic radiation could be reduced. In this embodiment, the metal or wave-adsorbing layer 700 pertains to a redistribution layer of an integrated circuit 70 or an ultra-thick metal layer (e.g., the outmost metal layer) of the integrated circuit 70. In alternative embodiment, the metal or wave-adsorbing layer 700 and the redistribution or ultra-thick metal layer pertain to the same layer. In the embodiment of FIG. 7, the steady voltage Vs is a DC voltage (e.g., a high voltage Vdd or low voltage Vss from a power supply), a grounding voltage (e.g., a voltage of a system ground or a chassis ground), or a voltage whose variation within a unit period is less than a predetermined value. Next please refer to FIG. 8. In another embodiment of the present invention, a guard ring 800 is formed around the LC tank 100, which means that the guard ring 800 is pertaining to and located around the periphery of the LC tank 100. Additionally, a layer such as the metal or wave-adsorbing layer 700 of FIG. 7 could be integrated with the guard ring 800, or the guard ring 800 itself is a metal or wave-adsorbing layer such as the layer 700.

Figure 9:
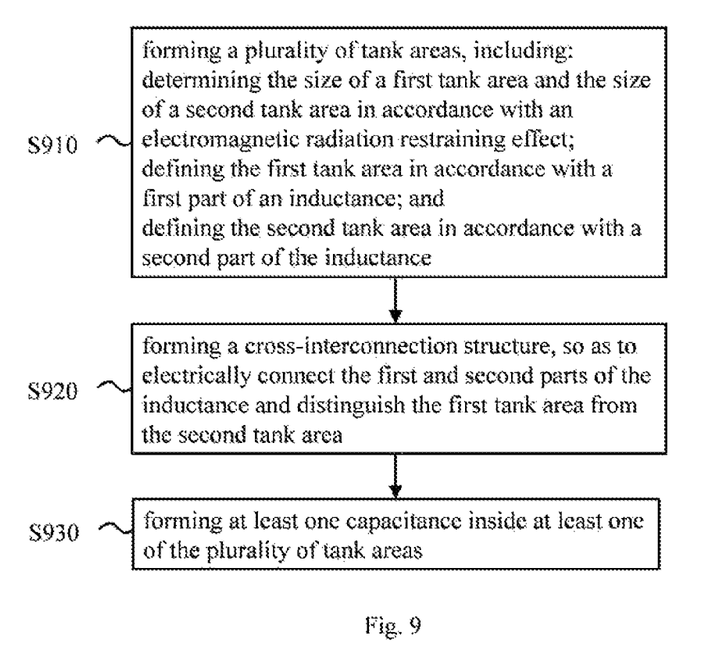
FIG. 9 illustrates an embodiment of the LC tank manufacturing method of the present invention.

In addition to the LC tank 100, the present invention also discloses a manufacturing method capable of making the LC tank 100 or the equivalent thereof. As it is shown in FIG. 9, an embodiment of the manufacturing method comprises the following steps:

Step S910: forming a plurality of tank areas. This step includes: determining the size of a first tank area and the size of a second tank area in accordance with an electromagnetic radiation restraining effect; defining the first tank area with a first part of an inductance; and defining the second tank area with a second part of the inductance in which the second part includes a gap which has been well explained in the preceding paragraphs. The resonance frequency of the above-mentioned tank areas could be determined by those carrying out the present invention in accordance with their demands. This step is used for forming the plurality of tank areas 110 of FIG. 1 or the equivalent thereof.

Step S920: forming a cross-interconnection structure, so as to electrically connect the first and second parts of the inductance and distinguish the first tank area from the second tank area. This step is used for forming any of the cross-interconnection structure 120 of FIG. 1 and the cross-interconnection structure 150 of FIG. 5 or the equivalent thereof.

Step S930: forming at least one capacitance inside at least one of the plurality of tank areas. This step is used for forming the at least one capacitance 130 of FIG. 1 or FIG. 6.

On the basis of the above, the present embodiment may further comprise at least one of the following features: the first and second tank areas are different in size (which could be area or volume in this specification); the first and second tank areas are different in shape; the electromagnetic radiation restraining effect is predetermined according to the relation between an area ratio of resonant areas and an electromagnetic radiation of an LC resonant tank including the resonant areas in which the relation is obtained through observation, simulation, experiment or measurement; the area ratio of the first tank area to the second tank area is between 20% and 80%, e.g., 40% and 60%; and the LC tank manufacturing method is a part of an integrated circuit manufacturing process, which implies that the LC tank made through the process is a part of an integrated circuit.

Since those of ordinary skill in the art can appreciate the detail and modification of this embodiment by referring to FIG. 1 through FIG. 8 and the explanation thereof, which means that the device embodiments of the aforementioned LC tank 100 and the features thereof can be applied to this method embodiment in an reasonable way, therefore repeated and redundant description is omitted while the existing disclosure is believed to be enough for understanding and enablement.

Please note that each embodiment in this specification includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of executing the present invention.

In summary, the LC tank and the manufacturing method of the present invention are capable of reducing electromagnetic radiation from the LC tank itself through a cross-interconnection structure and/or the control over an area ratio, reducing the layout area of the whole circuit by forming a capacitance inside a tank area, restraining the electromagnetic radiation more well by forming a metal or wave-adsorbing layer, and being realized through a developed and simple integrated circuit process. In brief, the present invention can resolve the electromagnetic radiation problem through the whole resonant tank, and is a thorough solution in comparison with the prior art.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An inductance-capacitance (LC) tank capable of reducing electromagnetic radiation by itself, comprising:
    a plurality of tank areas including:
        a first tank area whose boundary is defined by a first part of an inductance; and a second tank area whose boundary is defined by a second part of the inductance in which the second part includes a gap;

a cross-interconnection structure operable to electrically connect the first and second parts of the inductance and distinguish the first tank area from the second tank area; and at least one capacitance being inside at least one of the plurality of tank areas, wherein the area ratio of the first tank area to the second tank area is between 20% and 80%.

2. The LC tank of claim 1, wherein the first tank area is a closed area including no contacts for connection with an outside area, the second tank area is an open area including two contacts for connection with the outside area, and each of the contacts for connection with the outside area is operable to be connected with an element other than the LC tank.

3. The LC tank of claim 1, wherein the first and second tank areas are different in size.

4. The LC tank of claim 1, wherein the first and second tank areas are different in shape.

5. The LC tank of claim 1, wherein the area ratio of the first tank area to the second tank area is determined by an electromagnetic radiation restraining effect.

6. The LC tank of claim 1, which is a part of an integrated circuit.

7. The LC tank of claim 1, wherein the area ratio of the first tank area to the second tank area is set between 40% and 60%.

8. The LC tank of claim 1, wherein the at least one capacitance includes a plurality of capacitance units connected in parallel while at least one of the capacitance units is connected with the inductance through at least one switch that is operable to be turned on and off according to a control signal.

9. The LC tank of claim 1, wherein the plurality of tank areas further includes:

a third tank area whose boundary is defined by a third part of the inductance, and the LC tank further comprises:

another cross-interconnection structure operable to electrically connect the third and first parts of the inductance and distinguish the third tank area from the first tank area.

10. The LC tank of claim 9, wherein the at least one capacitance is set inside at least one of the first, second and third tank areas.

11. The LC tank of claim 1, further comprising a metal or wave-adsorbing layer to cover at least one side or at least one face of the LC tank itself in which the metal or wave-adsorbing layer is operable to be electrically connected with a steady voltage.

12. The LC tank of claim 11, wherein the metal or wave-adsorbing layer pertains to a redistribution layer of an integrated circuit, an ultra-thick metal layer of the integrated circuit or an outmost metal layer of the integrated circuit, or the metal or wave-adsorbing layer is at a layer to which the ultra-thick metal layer or the outmost metal layer pertains.

13. The LC tank of claim 11, wherein the metal or wave-adsorbing layer is integrated with a guard ring pertaining to and located around a periphery of the LC tank.

14. The LC tank of claim 1, wherein the first and second tank areas are at the same layer of an integrated circuit, and the cross-interconnection structure extends across multi-layers of the integrated circuit.

15. An inductance-capacitance (LC) tank manufacturing method for making an LC tank capable of reducing electromagnetic radiation by itself, comprising the following steps:

forming a plurality of tank areas including:

determining the size of a first tank area and the size of a second tank area in accordance with an electromagnetic radiation restraining effect;

defining the first tank area with a first part of an inductance; and defining the second tank area with a second part of the inductance in which the second part includes a gap;

forming a cross-interconnection structure operable to electrically connect the first and second parts of the inductance and distinguish the first tank area from the second tank area; and forming at least one non-parasitic physical capacitance inside at least one of the plurality of tank areas;

wherein the area ratio of the first tank area to the second tank area is between 40% and 60%.

16. The LC tank manufacturing method of claim 15, wherein the shape of the first tank area and the shape of the second tank area are asymmetric.

17. The LC tank manufacturing method of claim 15, wherein the size of the first tank area is different from the size of the second tank area.

* * * * *